United States Patent [19]

Hansen et al.

[11] 4,170,399

[45] Oct. 9, 1979

[54] LED FIBER OPTIC CONNECTOR

[75] Inventors: Niels J. Hansen; William Hintze, both of Camp Hill, Pa.

[73] Assignee: AMP Incorporated, Harrisburg, Pa.

[21] Appl. No.: 893,745

[22] Filed: Apr. 5, 1978

Related U.S. Application Data

[63] Continuation-in-part of Ser. No. 668,882, Mar. 22, 1976, abandoned.

[51] Int. Cl.$^2$ ............................................... G01B 5/14
[52] U.S. Cl. .................................... 350/96.20; 250/227
[58] Field of Search ............ 350/96.20, 96.21, 96.22; 250/227, 551; 357/17, 18, 19, 72; 339/17 LC; 29/588, 626

[56] References Cited

U.S. PATENT DOCUMENTS

| | | | |
|---|---|---|---|
| 2,869,040 | 1/1959 | Pifer | 29/626 |
| 3,614,550 | 10/1971 | Marinace | 357/72 |
| 3,628,036 | 12/1971 | Humphrey | 250/227 |
| 3,721,868 | 3/1973 | Smith, Jr. | 357/72 |
| 3,999,287 | 12/1976 | Lockard | 29/622 |
| 4,024,627 | 5/1977 | Stauffer | 29/588 |

OTHER PUBLICATIONS

C. A. Burrus et al., "Small-Area High-Current Density GaAs Electroluminescent Diodes..." App. Phy. Lett., vol. 17, No. 3, Aug. 1970, pp. 97-99.

D. Schicketanz et al. "Coupling Losses Between Laser Diodes and Multimode Glass Fibres" Optics Comm., vol. 5, No. 4, Jul. 1972, pp. 291-292.

Primary Examiner—Rolf G. Hille

[57] ABSTRACT

An improved and simplified connector scheme is disclosed for coupling the light output of a light emitting diode mounted in a flexible circuit to an optical fiber. The LED is mounted in flexible circuitry by a technique known as "poke in" which comprises forming a substantially H-shaped slot in a conductor portion of a circuit and the underlying flexible substrate on which the circuit is formed and inserting an LED into the slot in edgewise fashion. The optical fiber is placed in abutting position against one side edge of the LED and a suitable potting agent is applied thereto to make an integral unit. Preferably the potting agent also includes an outer layer of light reflecting material to prevent unwarranted loss of light from the remaining sides of the LED.

2 Claims, 5 Drawing Figures

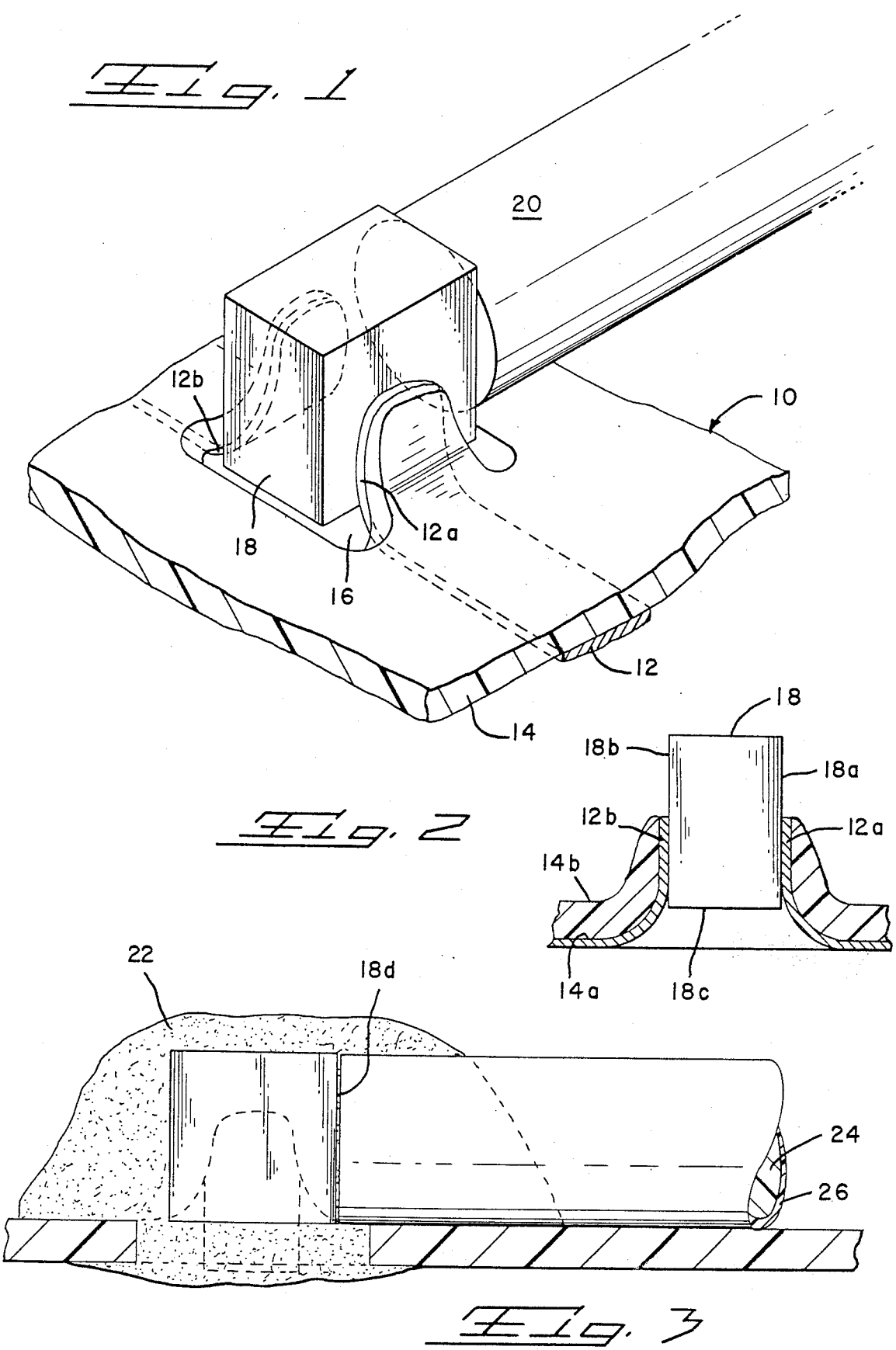

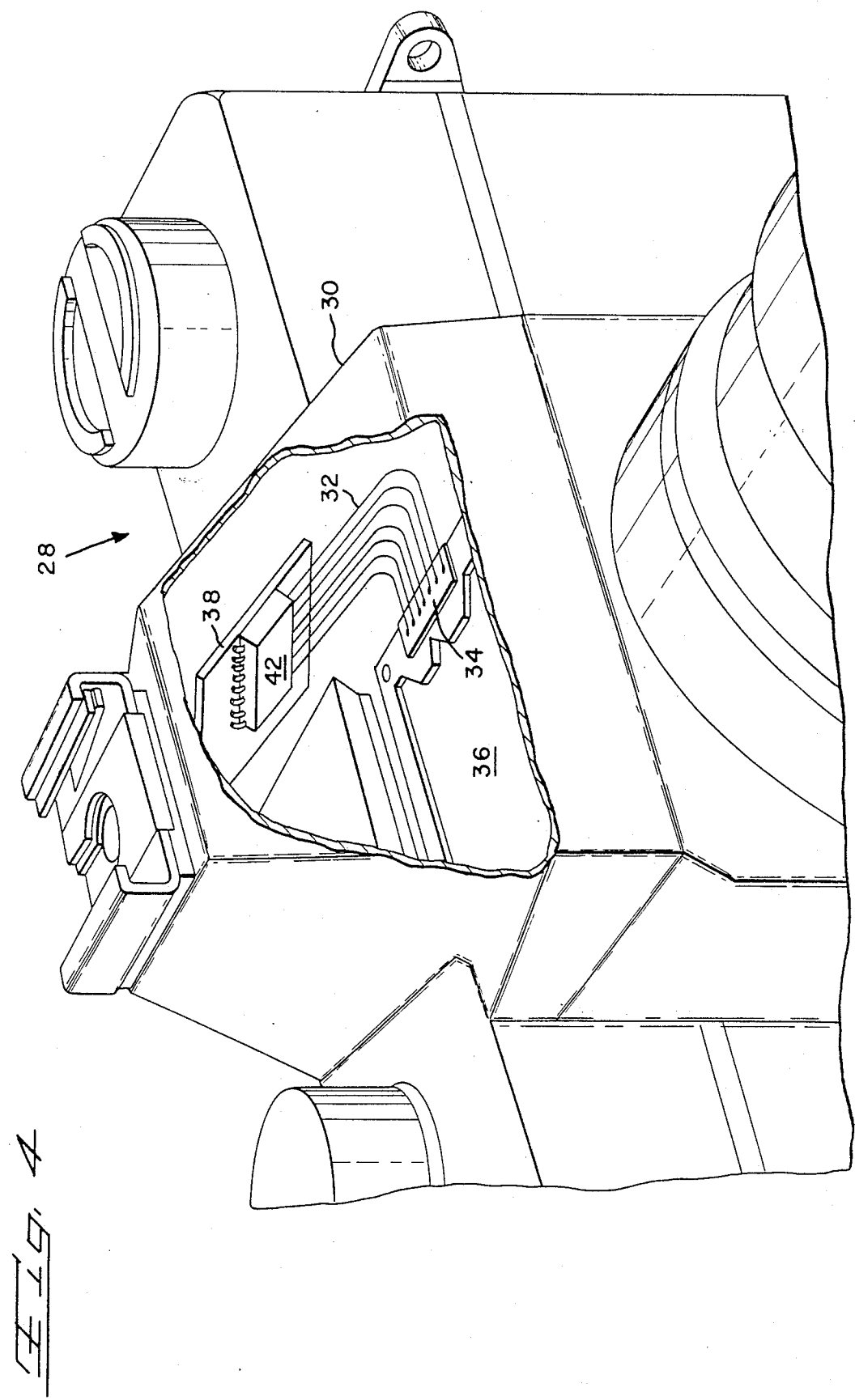

LED FIBER OPTIC CONNECTOR

CROSS REFERENCE TO RELATED APPLICATION

This application is a continuation-in-part of application Ser. No. 668,882, filed Mar. 22, 1976, now abandoned.

BACKGROUND OF THE INVENTION

1. The Field of the Invention

The present invention relates to a method and device for a low light loss coupling between light emitting diode mounted in a flexible circuit and an optical fiber of either glass or plastic.

2. The Prior Art

The development of both the LED and the optical fiber has created a need for an advantageous manner for connecting these two together so as to have the maximum amount of light from the LED coupled into the optical fiber. The previous methods for accomplishing this have not proved satisfactory in that bulky devices have been required for mounting the LED and the fibers, for example, see U.S. Pat. No. 3,932,761. Also, many of the known connecting devices have only been capable of mating bundles of fibers, rather than individual fibers thereby emphasizing the size of the entire coupled device and effectively reducing the amount of information that can be transmitted by the cable. Because of the nature of both optical fibers and LEDs, these devices can fulfill an illuminating function for small tightly fitting components, if suitable means can be provided to produce an efficient light coupling connection therebetween. The use of flexible circuitry in the combination also lends itself to positioning sensors in cramped quarters with the optical fiber transmitting information to a more convenient position for observation.

SUMMARY OF THE INVENTION

The present invention comprises an improved and efficient light coupling between an LED and an optical fiber. The LED is preferably mounted in a piece of flat flexible circuitry by a technique known as "poke in." This comprises causing an open in a conductor of the circuit and the flexible substrate by forming a substantially H-shaped slot therein. The LED is then inserted into the slot in edgewise fashion and held in position by the resiliency of the substrate. This resiliency also biases the conductor against the LED to complete the circuit. The optical fiber is placed in direct contact with an edge surface of the LED and the combination is then potted with a material, such as epoxy, to hold the unit in assembled configuration.

The unit, or assembly, eliminates the need for a separate holder member for either the LED or the optical fiber or waveguide. Both the LED and the waveguide have low profiles and are mounted on the flexible substrate and project outwardly therefrom on the same side of the substrate. The waveguide mounted against the substrate provides an integral unit of small size, as well as low profile; the unit thus being suitable for use in a limited available space such as within the confines of a camera. Only a small amount of potting material is utilized to bond the LED, the substrate, and the waveguide together to form an integral unit in such a manner that the flexibility of the substrate is not affected. The waveguide, for example, is anchored to the LED and also to the substrate, but only in close proximity to the LED. The remainder of the substrate and the remainder of the waveguide are freely flexible, either together or separately, allowing versatile flexible orientation of the assembly to conform to an irregular and compact passageway or container such as might be found within the confines of a camera. If desired, the waveguide may be anchored to the substrate at a location remote from the integral unit. Such an anchor may comprise a strain relief of any suitable type or a standard optical connector or mounting member. Such an anchor may be provided wherever space is more available; which might be remote from rather than immediately adjacent to the integral unit. In any case, the anchor is optional and is not required as part of the integral unit according to the present invention.

It is therefore an object of the present invention to produce an improved light transmitting coupling between an optical fiber and an LED in which there will be maximum transmission of the light from the LED into the optical fiber.

It is another object of the present invention to produce an LED-optical fiber connection which is of small dimensions.

It is yet another object of the present invention to produce an improved LED-optical fiber connector which can be readily and economically produced.

It is still another object of the present invention to enable collection of light emitted by two or more LEDs at spaced locations and present the light output as intense beams in a coordinated fashion or array at a single location.

It is a further object of the present invention to enable light emitted from two or more LEDs in a closely spaced array to be displayed in a coordinated fashion at one or more remote positions.

It is a further object of the present invention to provide an improved optical junction, of an optical waveguide and an LED, which has a low profile and is of small size when utilized with flexible circuitry, and further which eliminates the need for a separate holder for either the LED or the optical waveguide and which does not impair the flexibility of either the substrate or the waveguide.

The means for accomplishing the foregoing objects and other advantages will become apparent to those skilled in the art from the detailed description made with reference to the accompanying drawings.

BRIEF DESCRIPTION OF THE DRAWINGS

FIG. 1 is an enlarged perspective view of an LED-optical fiber connection according to the present invention;

FIG. 2 is a vertical transverse section through the LED of FIG. 1;

FIG. 3 is a side elevation, partially in section, of the LED-optical fiber connection of FIG. 1;

FIG. 4 is a perspective view, partially broken away, of a single lens reflex camera incorporating the subject LED optical fiber assembly.

DETAILED DESCRIPTION OF THE PREFERRED EMBODIMENT

Figure 5:
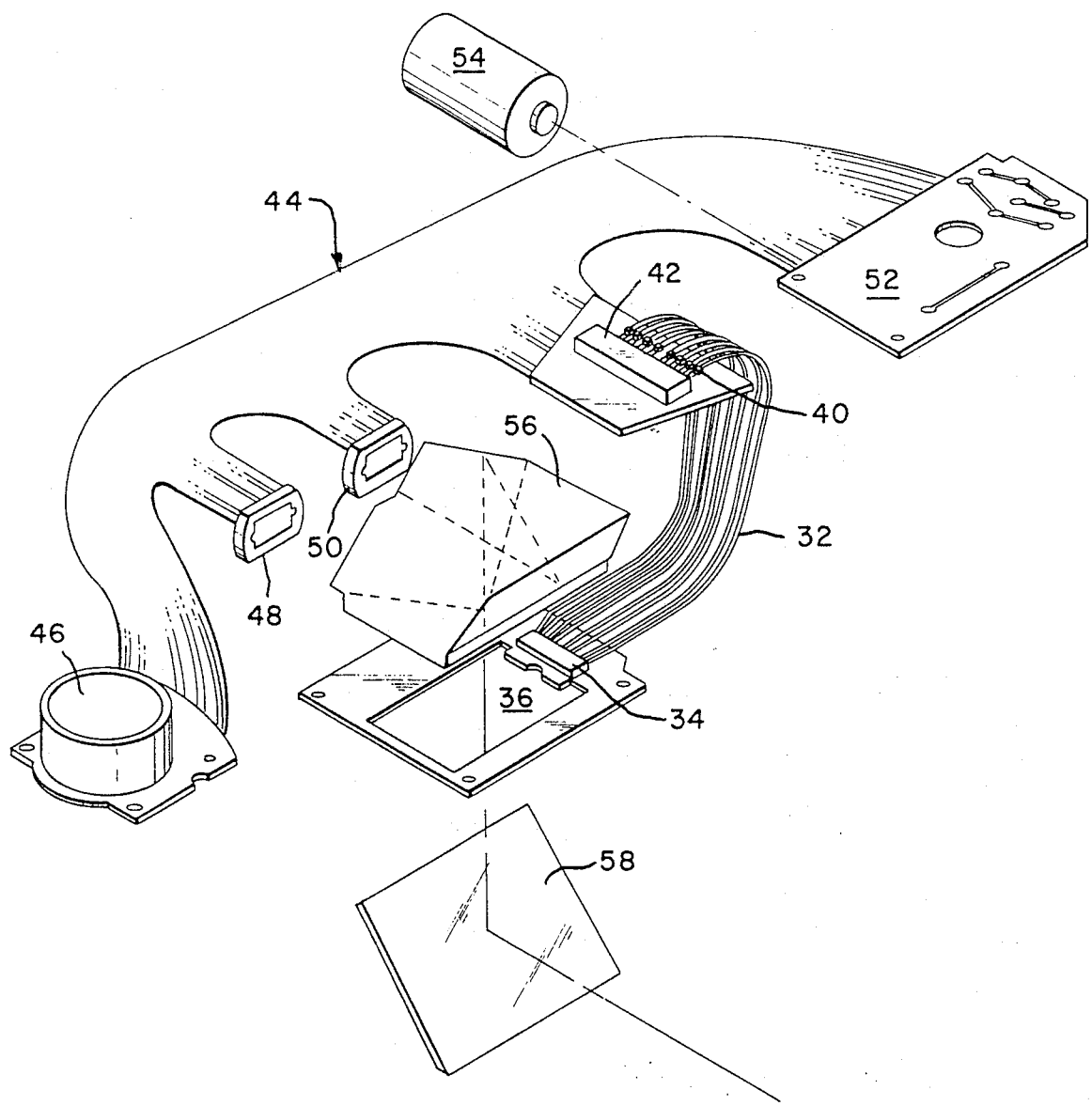
FIG. 5 is an exploded diagrammatic view of some of the components of the camera shown in FIG. 4 with the subject invention incorporated therein.

A flat flexible circuit, generally noted by reference numeral 10, comprises a metallized pattern of conductors 12 on one surface of a flexible insulator substrate 14. The flexible circuit has a generally H-shaped slot 16 cut therein with the cross bar portion of the H causing an open in the conductor 12. A light emitting diode 18 is inserted into the slot in edgewise fashion so that the segments or flaps 12a, 12b of the conductor 12 engage opposite faces 18a, 18b thereof, as best seen in FIG. 2. The segments are resiliently deflected by the LED outwardly of the plane of the remainder of the substrate and resiliently bias the conductors 12 into compressed engagement with the LED anode and electrode conductive surfaces. The LED 18 should be inserted into the slot 16 from the conductor side of the flexible circuit 10 until the bottom edge 18c is (at least within the thickness of the substrate 14 or) at least between being substantially flush with the bottom surface 14a of the substrate and substantially flush with the upper surface 14b of the substrate. Insertion of the LED with its bottom surface 18c projecting below surface 14a of the substrate would result in an undesirable masking of the light output from the LED. Insertion of the LED with its bottom surface 18c beyond the upper surface 14b could result not only in poor electrical contact but in insufficient clamping by the resilient substrate.

The end of an optical fiber 20 is brought into abutting relationship with the emission edge 18d of the LED 18 and a potting material 22, such as epoxy, is placed thereabout to bond the fiber 20, the LED 18, and the flat flexible circuitry 10 into an integral unit. The epoxy also serves as a wetting agent to enhance the light coupling between the LED and the optical fiber. It should be noted that the epoxy can also be subsequently coated with a light reflecting material to insure maximum coupling of the light emitted from the LED into the fiber optic.

Thus a single quantity of light transmitting encapsulant material bonds to the optical waveguide and the LED to form an optical junction. Further, the encapsulant material bonds to the LED and to the conductive metal layer or circuitry securing the LED mechanically as well as electrically to the circuitry. Further the encapsulant material bonds to the LED and to the substrate segments or flaps 12a and 12b and also to the remainder of the substrate and also to an end portion of the optical waveguide immediately adjacent to the LED to form an integral unit of small size and low profile projecting outwardly of only the top surface of the substrate, the unit not interfering with flexibility of either the remainder of the substrate or the remainder of the optical waveguide.

In some uses of the invention the epoxy may suffice to secure the LED, fiber, and flexible circuit together. Additional security may be had when desired, for example, by taping the fiber to the flexible circuit with adhesive tape or fixing both the fiber and flexible circuit to a rigid member, which may be an optical waveguide connector or an IC package connector of any type well known in the prior art. In any case, the auxiliary means which anchors the fiber to the flexible circuit is optional and is not required in the potted integral unit as described. A further advantage allows the optional connector or anchor to be located remote from the optical junction or potted integral unit according to the present invention.

The flexible circuitry 10 is of conventional construction having a flexible substrate 14 of approximately 1 to 5 mil stock of Mylar, Kapton, or the like, with approximately half mil thick circuitry 12 formed thereon by conventional plating and/or etching methods known in the printed circuit board manufacturing industry. The LED would be approximately 15 to 17 mils square, 10 to 12 mils in thickness and either with blanket metallization or with a patterned conductive array formed on two opposite surfaces 18a, 18b thereof. The LED can be made from any of the known materials, such as gallium phosphide, and may be a coherent or incoherent light emitter, but in either case must have at least one emission edge 18d against which the optical fiber would be abutted. The optical fiber 20 is of known type and may be made of either glass or plastic. The fiber preferably has a light transmitting core 24 surrounded by a light reflecting jacketing 26 and is in a range of size between 15 and 40 mils in diameter. A typical optical fiber would be PFX 0715 manufactured by DuPont and which has an outside diameter of 14.6 mils, a core refractive index of 1.49, and an acceptance angle of 64°.

In the embodiment shown in FIGS. 1 to 3 with the materials as outlined in the preceding paragraph, there will be a substantial amount of light emitted from the LED coupled into the optical fiber. There are several reasons for this good coupling effect. First, the diameter of the fiber exceeds the thickness of the LED so that substantially all of the light emitted from that edge will pass directly into the fiber. Second, the fiber has a wide angle of acceptance that encompasses substantially all of the light which is emitted through the surface of the LED, the intensity of the emitted light varying approximately as the cosine function. Third, the epoxy used to bond the members together has an index of refraction on the order of 1.50 to 1.55 compared to 1.49 for the fiber and 3.5 for the chip. Thus, the epoxy wets both surfaces and provides a coupling therebetween such that approximately 30% of the light emitted through the LED surface will be coupled into the fiber (which light is of the order of 2% of the total light generated in the LED junction).

For light generated in the diode junction and emitted isotropically, only that light which is incident on an interface at an angle less than the critical angle for total internal reflection will escape from the chip. If $F_o$ is the total luminous flux generated in the junction and emitted toward a given surface and $\theta_c$ is the critical angle for total internal reflection, the luminous flux incident within the core defined by the critical angle, and hence escaping through the surface will be $$F = F_o(1 - \cos \theta_c)$$

The angular distribution of the intensity of this radiation is given approximately by the cosine function, $I(e) = I \cos o$. If the acceptance angle of the fiber is $O_A$, then the luminous flux that is coupled into the fiber bonded to the diode face with epoxy resil will be $$F_c = F_o/2(1 - \cos \theta_c)(1 - \cos 2\theta_A)$$

For PFX optical fiber, the acceptance angle in air is 32°; when coupled to epoxy of refractive index $M = 1.5$ the acceptance angle is $\theta_A = 22°$.

For GaP, the critical angle for internal reflection for extraction into epoxy resin is $\theta_c = 27.5°$. The flux coupled into the fiber will be $$F = 0.016 \, F_o$$

That is, approximately 2% of total light incident on the surface will be coupled into the fiber. This is 30% of the total flux that escapes through the surface.

An embodiment of the present invention is shown in FIG. 4 incorporated into a 35 mm single lens reflex camera. The camera 28 has a plurality of sensing components (see FIG. 5) located at various points in the camera housing 30. A display of the outputs of these sensing components in the viewing aperture is made possible by having a plurality of optical fibers 32 extending between a display 34 on the view finder screen 36 and a circuit 38 containing a like plurality of LEDs 40, each coupled to a respective one of the fibers 32. An integrated circuit 42 receives the outputs of the various sensing components and causes the proper information to register at display 34 by illuminating required LEDs 40. The light from the LEDs 40 is coupled to the adjacent fibers 32 and directed to the appropriate portion of the display 34.

The inventive components involved in the camera of FIG. 4 are shown in an exploded diagrammatic view in FIG. 5. The continuous flat flexible circuit 44 extends, from left to right, between the winding mechanism 46, the light sensors 48, 50, the IC 42, LEDs 40, and the battery mechanism 52. Also shown are battery 54, pentaprisim 56, and mirror 58. Means on the circuit sense the condition of the camera, such as a good battery, adequate light for the speed and aperture setting, and film advance, and in turn cause the IC 42 to display the information at display 34 by the light emitted by the appropriate LED 40. For example, energize an LED when there is insufficient light for the aperture and speed setting of the camera or when the battery is bad or when there is no film in the camera or the film hasn't been advanced.

The present invention may be subject to many modifications and changes without departing from the spirit or essential characteristics thereof. The present embodiment is, therefore, to be considered in all respects as illustrative and not restrictive of the scope of the invention.

What is claimed is:

1. In a bonded optical connection of an optical and flexible waveguide and an edge emitting, chip form light emitting diode (LED), together with electrical connection means for the LED, the improvement consisting of:

said LED including a leading edge and an opposed trailing edge, said LED further including a pair of conductive surfaces and an emitting edge, each of which extend from said leading edge to said trailing edge, said electrical connection means includes a flexible insulative substrate having a first surface and a second surface separated by the thickness of said substrate, an H-shaped slot provided through said substrate providing a pair of opposed segments of said substrate wherein each of said segments is bonded on three sides by said slot, a layer of conductive material provided on said substrate second surface and at least partially covering each of said segments, thereby providing an electrical circuit along said segments which is interrupted by said slot, said LED being mounted in said slot with said leading edge thereof projecting outwardly of said substrate first surface and with said trailing edge disposed within said slot and positioned in a range either between said substrate first and second surface or flush with either said substrate first and second surfaces, said conductive material layer on said segments engaging corresponding LED conductive surfaces, said substrate segments being resiliently deflected by said LED outwardly of the plane of the remainder of said substrate and said segments resiliently biasing said conductive material layer into engagement with said LED conductive surfaces, said optical waveguide having an end abutting said LED emitting edge, said optical waveguide having an end portion immediately adjacent said end thereof mounted against said substrate first surface, and a single quantity of light transmitting encapsulant material bonding to said optical waveguide and said LED emitting edge to form an optical junction, said light transmitting encapsulant material also bonding to said LED and said conductive metal layer to secure said LED mechanically as well as electrically to said conductive metal layer, said light transmitting encapsulant material also bonding to said LED and said substrate segments and the remainder of said substrate and said end portion of said optical waveguide to form an integral unit of low profile projecting outwardly of only said substrate first surface without interfering with the flexibility of either said substrate or said waveguide.

2. The structure of claim 1 and further including:

means for anchoring said waveguide to said substrate remote from said encapsulant material.

* * * * *